(12) United States Patent
Hwang et al.

(10) Patent No.: US 8,728,882 B2
(45) Date of Patent: May 20, 2014

(54) MANUFACTURING METHOD FOR THIN FILM TRANSISTOR ARRAY PANEL

(75) Inventors: Jae Seung Hwang, Suwon-si (KR); Jae-Won Lee, Asan-si (KR); Jun Seo, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/569,586

(22) Filed: Aug. 8, 2012

(65) Prior Publication Data

US 2013/0260568 A1 Oct. 3, 2013

(30) Foreign Application Priority Data

Mar. 30, 2012 (KR) .......................... 10-2012-0033254

(51) Int. Cl.
*H01L 21/00* (2006.01)
*H01L 21/84* (2006.01)

(52) U.S. Cl.
USPC .............. 438/161; 438/189; 438/195; 257/66

(58) Field of Classification Search
None
See application file for complete search history.

(56) References Cited

U.S. PATENT DOCUMENTS

| | | | |
|---|---|---|---|
| 5,514,425 A | 5/1996 | Ito et al. | |
| 7,468,320 B2 | 12/2008 | Hu et al. | |
| 7,585,761 B2 | 9/2009 | Yamazaki et al. | |
| 7,833,850 B2 * | 11/2010 | Choi et al. | ..................... 438/161 |
| 2003/0056388 A1 | 3/2003 | Ohno et al. | |
| 2005/0181582 A1 * | 8/2005 | You | .............................. 438/479 |
| 2008/0093334 A1 * | 4/2008 | Choi et al. | ....................... 216/13 |
| 2009/0068844 A1 | 3/2009 | Pischtiak et al. | |

FOREIGN PATENT DOCUMENTS

| | | |
|---|---|---|
| JP | 07201819 A | 8/1995 |
| JP | 08153711 A | 6/1996 |
| JP | 2000288345 A | 10/2000 |
| JP | 2002319569 A | 10/2002 |
| JP | 3643807 A | 2/2005 |
| JP | 2008252050 A | 10/2008 |
| JP | 4435388 A | 1/2010 |
| KR | 100361209 A | 11/2002 |
| KR | 100466310 A | 1/2005 |
| KR | 100495856 A | 6/2005 |
| KR | 1020070120324 A | 12/2007 |
| KR | 1020080051483 A | 6/2008 |
| KR | 1020090044302 A | 5/2009 |
| KR | 1020090085215 A | 8/2009 |
| KR | 1020110078443 A | 7/2011 |

* cited by examiner

*Primary Examiner* — Duy Deo
(74) *Attorney, Agent, or Firm* — Cantor Colburn LLP

(57) ABSTRACT

A manufacturing method for a thin film transistor array panel includes: providing a gate line including a gate electrode, on a substrate; providing a gate insulating layer covering the gate line; providing a semiconductor material layer on the gate insulating layer; providing a data wire material layer on the semiconductor material layer; providing a first photosensitive film pattern on the data wire material layer; etching the data wire material layer by using the first photosensitive film pattern as a mask; providing a second photosensitive film pattern by etching back the first photosensitive film pattern; etching the semiconductor material layer by using the second photosensitive film pattern as a mask; and etching the data wire material layer by using the second photosensitive film pattern as a mask to form a source electrode and a drain electrode. The etching the semiconductor material layer uses a first non-sulfur fluorinated gas.

21 Claims, 16 Drawing Sheets

MANUFACTURING METHOD FOR THIN FILM TRANSISTOR ARRAY PANEL

This application claims priority to Korean Patent Application No. 10-2012-0033254 filed on Mar. 30, 2012, and all the benefits accruing therefrom under 35 U.S.C. §119, the entire contents of which are incorporated herein by reference.

BACKGROUND (a) Field

The invention relates to a manufacturing method for a thin film transistor array panel.

(b) Description of the Related Art

In general, a thin film transistor array panel is used as a circuit board for independently driving each pixel in a liquid crystal display, an organic electro luminescence ("EL") display, or the like. The thin film transistor array panel includes, a gate wire transferring a scanning signal, a data wire transferring an image signal, a thin film transistor connected with the gate wire and the data wire, a pixel electrode connected with the thin film transistor, and the like.

The thin film transistor further includes a semiconductor layer forming a channel of the thin film transistor and a gate electrode, which are a part of the gate wire, and a source electrode and a drain electrode which are a part of the data wire. The thin film transistor is a switching element transferring or blocking the image signal transferred through the data wire to or from the pixel electrode according to the scanning signal transferred through the gate wire.

Recently, as a large-sized area and pixelization of a display device are demanded, a length of a wire such as the gate wire or the data wire has been increased, but a line width thereof has been decreased.

Accordingly, specific resistance and capacitance value of the wire are rapidly increased and thus there is a problem in that image distortion due to signal delay occurs.

SUMMARY

The invention has been made in an effort to provide a manufacturing method for a thin film transistor array panel having advantages of improving a characteristic of a thin film transistor.

An exemplary embodiment of the invention provides a manufacturing method for a thin film transistor array panel, the method including: providing a gate line including a gate electrode, on a substrate; providing a gate insulating layer covering the gate line; providing a semiconductor material layer on the gate insulating layer; providing a data wire material layer on the semiconductor material layer; providing a first photosensitive film pattern on the data wire material layer, the first photosensitive film pattern including a first region, and a second region having a larger thickness than the first region; etching the data wire material layer by using the first photosensitive film pattern as a mask; providing a second photosensitive film pattern by etching back the first photosensitive film pattern; etching the semiconductor material layer by using the second photosensitive film pattern as a mask; and etching the data wire material layer by using the second photosensitive film pattern as a mask to form a source electrode and a drain electrode. The etching the semiconductor material layer uses a first non-sulfur (S) fluorinated gas.

The first non-sulfur fluorinated gas may include at least one of nitrogen trifluoride (NF3), tetrafluoromethane (CF4), hexafluoroethane (C2F6), trifluoromethane (CHF3), difluoromethane (CH2F2), fluoromethane (CH3F), hexafluorobutyne (C4F6), octafluorobutene (C4F8), octafluoropentyne (C5F8), or fluorine (F2).

The second photosensitive film pattern may expose a portion of the semiconductor material layer corresponding to a channel region of a thin film transistor.

The data wire material layer may be provided by laminating a first metal layer and a second metal layer in sequence.

The first metal layer may include at least one of titanium, tantalum, molybdenum, or an alloy thereof, and the second metal layer may include copper or a copper alloy.

The etching the data wire material layer by using the first photosensitive film pattern as a mask may include wet-etching.

The etching the semiconductor material layer may include dry-etching by adding second gas including at least one of chlorine gas (Cl2), oxygen gas (O2), nitrogen gas (N2), or helium gas (He), to the first non-sulfur (S) fluorinated gas.

The semiconductor material layer may be etched in a state where etching selectivity of the semiconductor material layer and the gate insulating layer is about 0.85:1 or more, by adding the second gas into the first non-sulfur (S) fluorinated gas.

The manufacturing method for a thin film transistor array panel may further include removing the second photosensitive film pattern; providing a passivation layer including a contact hole exposing the drain electrode, after the removing the second photosensitive film pattern; and providing a pixel electrode connected with the drain electrode through the contact hole, on the passivation layer.

The providing of the passivation layer including the contact hole may use a second non-sulfur (S) fluorinated gas.

The second non-sulfur fluorinated gas may include at least one of nitrogen trifluoride (NF3), tetrafluoromethane (CF4), hexafluoroethane (C2F6), trifluoromethane (CHF3), difluoromethane (CH2F2), fluoromethane (CH3F), hexafluorobutyne (C4F6), octafluorobutene (C4F8), octafluoropentyne (C5F8), or fluorine (F2).

Another exemplary embodiment of the invention provides a manufacturing method for a thin film transistor array panel, the method including: providing a gate line including a gate electrode, on a substrate; providing a gate insulating layer covering the gate line; providing a semiconductor material layer on the gate insulating layer; providing a data wire material layer on the semiconductor material layer; providing a first photosensitive film pattern on the data wire material layer, the first photosensitive film pattern including a first region and a second region having a larger thickness than the first region; etching the data wire material layer by using the first photosensitive film pattern as a mask; etching the semiconductor material layer by using the first photosensitive film pattern as a mask; providing a second photosensitive film pattern by etching back the first photosensitive film pattern; and etching the data wire material layer by using the second photosensitive film pattern as a mask. The etching the semiconductor material layer uses a first non-sulfur (S) fluorinated gas.

The first non-sulfur (S) fluorinated gas may include nitrogen trifluoride (NF3) or tetrafluoromethane (CF4).

The second photosensitive film pattern may expose a portion of the semiconductor material layer corresponding to a channel region of a thin film transistor.

The data wire material layer may be provided by laminating a first metal layer and a second metal layer in sequence.

The first metal layer may include at least one of titanium, tantalum, molybdenum, or an alloy thereof, and the second metal layer may be include copper or a copper alloy.

The etching the data wire material layer by using the first photosensitive film pattern as a mask may include wet-etching.

The etching the semiconductor material layer may include dry-etching by adding second gas including at least one of chlorine gas (Cl2), oxygen gas (O2), nitrogen gas (N2), or helium gas (He), to the first non-sulfur (S) fluorinated gas.

The semiconductor material layer may be etched in a state where etching selectivity of the semiconductor material layer and the gate insulating layer is about 0.85:1 or more, by adding the second gas to the first non-sulfur (S) fluorinated gas.

The manufacturing method for a thin film transistor array panel may further include removing the second photosensitive film pattern; providing a passivation layer including a contact hole exposing the drain electrode, after the removing the second photosensitive film pattern; and providing a pixel electrode connected with the drain electrode through the contact hole, on the passivation layer.

The providing of the passivation layer including the contact hole may use a second non-sulfur (S) fluorinated gas.

The second non-sulfur fluorinated gas may include nitrogen trifluoride (NF3) or tetrafluoromethane (CF4).

According to one or more exemplary embodiment of the invention, the corrosion of a wire and the generation of a metal residue film are suppressed by providing a thin film transistor through a method using non-sulfur fluorinated gas, such that it is possible to improve a characteristic of a thin film transistor.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
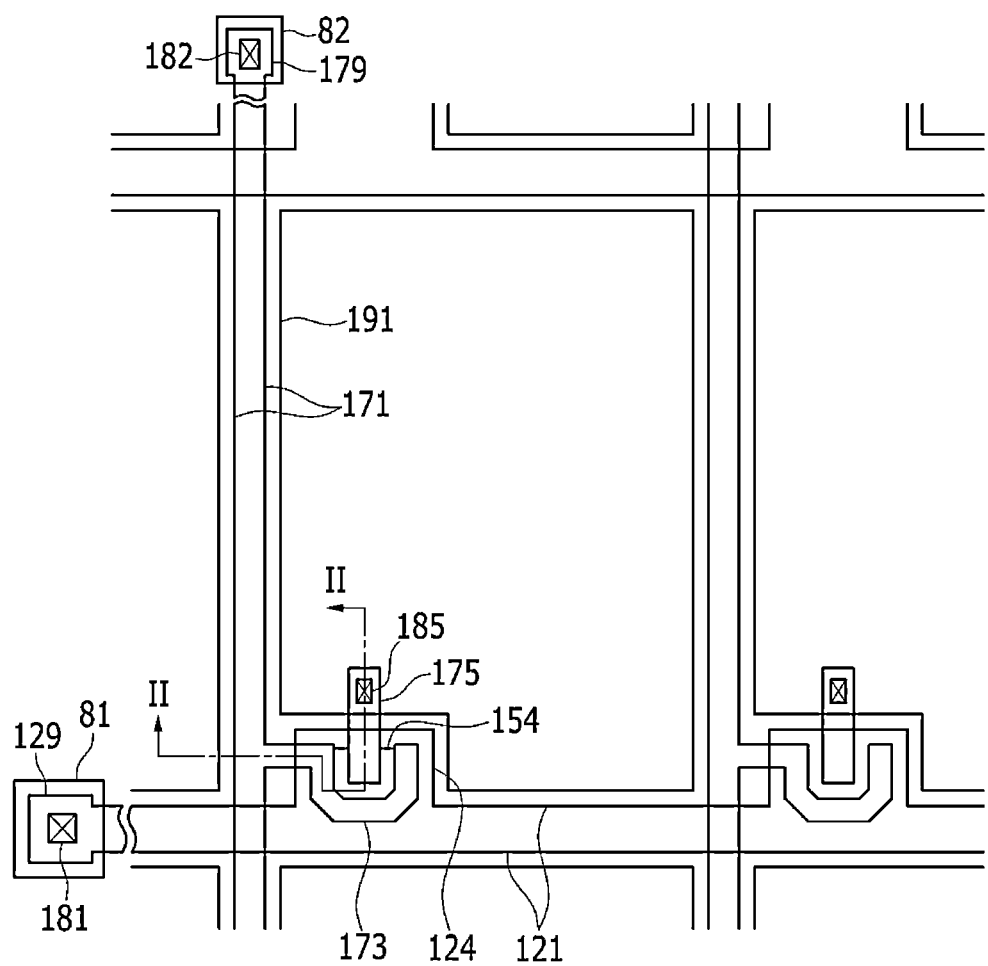
FIG. 1 is a plan view illustrating an exemplary embodiment of a thin film transistor array panel according to the invention.

Hereinafter, exemplary embodiments of the invention will be described in detail with reference to the accompanying drawings. As those skilled in the art would realize, the described embodiments may be modified in various different ways, all without departing from the spirit or scope of the invention. Exemplary embodiments introduced herein are provided to make disclosed contents thorough and complete and sufficient transfer the spirit of the invention to those skilled in the art.

In the drawings, the thickness of layers, films, panels, regions, etc., are exaggerated for clarity. It will be understood that when a layer is referred to as being "on" another layer or substrate, it can be directly on the other layer or intervening them may also be present. In contrast, when an element is referred to as being "directly on," "directly connected to" or "directly coupled to" another element or layer, there are no intervening elements or layers present. As used herein, connected may refer to elements being physically and/or electrically connected to each other. As used herein, the term "and/or" includes any and all combinations of one or more of the associated listed items. Like reference numerals designate like elements throughout the specification.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "below," "lower," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "lower" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

A process for forming a low resistance wire is importantly recognized. A silver or copper-based wire having excellent electric conductivity is regarded as a low resistance wire as compared with an aluminum-based wire in the related art. However, the copper wire and the like generate a metal residue film by a material used during etching of a subsequent process to deteriorate a characteristic of a channel of the thin film transistor.

Figure 2:
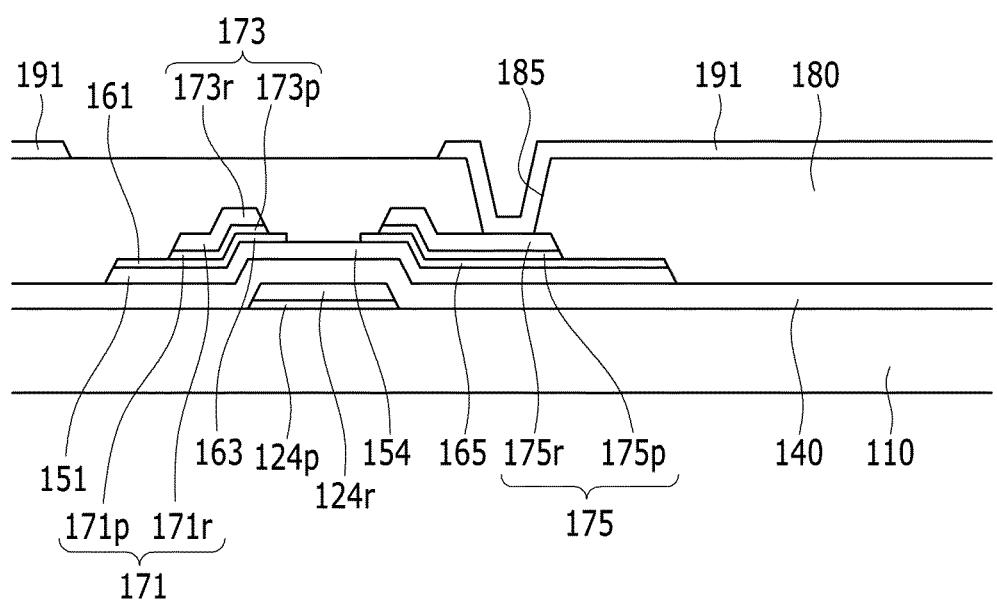
FIG. 2 is a cross-sectional view taken along line II-II of FIG. 1.

FIG. 1 is a plan view illustrating an exemplary embodiment of a thin film transistor array panel according to the invention. FIG. 2 is a cross-sectional view taken along line II-II of FIG. 1.

Referring to FIGS. 1 and 2, a gate line 121 is on an insulation substrate 110. The insulation substrate 110 may include transparent glass or plastic. The thin film transistor array panel may include a plurality of gate lines 121.

The gate lines 121 transfer gate signals and have a longitudinal axis that is mainly extended in a first (e.g., horizontal in FIG. 1) direction. Each gate line 121 include a plurality of gate electrodes 124 protruding from a main portion of the gate line 121, and a wide area end portion 129 for connection with another layer or a gate driver (not shown).

The gate line 121 and the gate electrode 124 have a dual-layered structure configured by lower layers 121p (not shown) and 124p and upper layers 121r (not shown) and 124r. The lower layers 121p and 124p may include at least one of titanium, tantalum, molybdenum, or an alloy thereof, and the upper layers 121r and 124r may include copper (Cu) or a copper alloy. In the exemplary embodiment, the gate line 121 and the gate electrode 124 have the dual-layered structure, but the invention is not limited thereto or thereby. In an alternative exemplary embodiment, the gate line 121 and the gate electrode 124 may have a single-layered structure.

A gate insulating layer 140 including an insulating material such as silicon nitride is on the gate line 121.

One or more semiconductor layer 151 including hydrogenated amorphous silicon, polysilicon, or the like is on the gate insulating layer 140. The semiconductor layers 151 have a longitudinal axis that mainly extends in a second (e.g., vertical in FIG. 1) direction which intersects the first direction. The semiconductor layers 151 include a plurality of projections 154 extended toward the gate electrode 124.

A plurality of ohmic contact stripes 161 and ohmic contact islands 165 are on the projections 154 of the semiconductor layers 151. The ohmic contact stripes 161 have a plurality of projections 163. The projection 163 and the ohmic contact island 165 form a pair and are disposed on and overlapping a projection 154 of the semiconductor layers 151.

The thin film transistor array panel further includes a source electrode 173 connected to and continuous with a data line 171, and a drain electrode 175 facing the source electrode 173, and on the ohmic contacts 161 and 165 and on the gate insulating layer 140. The thin film transistor array panel may include a plurality of source electrodes 173 connected to a plurality of data lines 171, respectively, and a plurality of drain electrodes 175 facing the source electrodes 173, on the ohmic contacts 161 and 165 and on the gate insulating layer 140.

The data lines 171 transfer data signals and have a longitudinal axis that mainly extends in the second (vertical) direction to cross the gate lines 121. The source electrode 173 may extend toward the gate electrode 124 and may have a U-shape in the plan view, but the source electrode 173 may have various modified shapes.

The drain electrode 175 is separated from the data line 171 and is extended from the center of the U-shape of the source electrode 173 and upward vertically. The data line 171 includes a wide area end portion 179 for connection with another layer or a data driver (not shown).

The data line 171, the source electrode 173 and the drain electrode 175 also have a dual-layered structure of upper layers 171r, 173r and 175r and lower layers 171p, 173p and 175p. The upper layers 171r, 173r and 175r may include copper (Cu) or a copper alloy, and the lower layers 171p, 173p, and 175p may include at least one of titanium (Ti), tantalum (Ta), molybdenum (Mo), or an alloy thereof.

The lower layers 171p, 173p and 175p and the upper layers 171r, 173r and 175r of the data line 171, the source electrode 173, and the drain electrode 175 may have tapered sides, respectively, in a the cross-sectional view.

The ohmic contacts 161, 163 and 165 are disposed only between the semiconductors 151 and 154 disposed therebelow, and the lower layers 171p, 173p and 175p of the data line 171 and the drain electrode 175 disposed thereabove, and lower contact resistance therebetween. Further, the ohmic contacts 161, 163 and 165 have substantially the same planar pattern as the lower layers 171p, 173p and 175p of the data line 171, the source electrode 173 and the drain electrode 175.

The semiconductor layer 151 includes an exposed portion which is not covered by the data line 171 and the drain electrode 175 in addition to the source electrode 173 and the drain electrode 175, and the exposed portion is at the projection 154 of the semiconductor layer 151. The semiconductor layer 151 has substantially the same planar pattern as the ohmic contacts 161 and 165 except for the exposed portion projection 154.

One gate electrode 124, one source electrode 173 and one drain electrode 175 collectively form one thin film transistor ("TFT") together with the projection 154 of the semiconductor layer 151. A channel of the thin film transistor is formed at the projection 154 between the source electrode 173 and the drain electrode 175. According to an exemplary embodiment of the invention, in a process of forming the thin film transistor, an etching process for forming the semiconductor layer 151 is performed by using non-sulfur fluorine (F)-based gas, which may be otherwise referred to as a "fluorinated gas." As used herein, "fluorinated" means that a compound includes at least one fluorine atom.

A passivation layer 180 is on the data line 171, the drain electrode 175 and the projection 154 of the exposed semiconductor layer 151. The passivation layer 180 includes an inorganic insulator such as at least one of silicon nitride or silicon oxide, an organic insulator, a low dielectric insulator, or the like.

The passivation layer 180 covers and may contact the upper surface of the lower layers 171p, 173p and 175p which partially protrude from the edge of the upper layers 171r, 173r and 175r and the upper surface of the semiconductor layer 151 which partially protrudes from, the horizontal edge of the lower layers 171p, 173p and 175p.

The passivation layer 180 includes a contact hole 181 exposing the wide area end portion 129 of the gate line 121, a contact hole 182 exposing the wide area end portion 179 of the data line 171, and a contact hole 185 exposing an end portion of the drain electrode 175. The passivation layer 180 may include a plurality of contact holes 181, 182 and/or 185 Further, according to an exemplary embodiment of the invention, a patterning process of forming the contact holes 181, 182 and 185 is performed by using non-sulfur fluorine-based gas. The non-sulfur fluorine-based gas includes at least one of nitrogen trifluoride (NF3), tetrafluoromethane (CF4), hexafluoroethane (C2F6), trifluoromethane (CHF3), difluoromethane (CH2F2), fluoromethane (CH3F), hexafluorobutyne (C4F6), octafluorobutene (C4F8), octafluoropentyne (C5F8), or fluorine (F2).

One or more pixel electrode 191 and contact assistant 81 and 82 is on the passivation layer 180. The pixel electrode 191 is physically and electrically connected with the drain electrode 175 through the contact hole 185 and receives data voltage from the drain electrode 175.

The exemplary embodiment of the thin film transistor array panel according to the invention may be applied to a display device such as a liquid crystal display or an organic light emitting diode display, but the invention is not limited thereto or thereby. In the case of the liquid crystal display, the pixel electrode 191 to which the data voltage is applied, generates an electric field together with a common electrode (not shown) receiving common voltage and on the thin film transistor array panel or a display panel facing the thin film transistor array panel, to determine a direction of liquid crystal molecules of a liquid crystal layer (not shown) between the pixel and common electrodes. The pixel electrode 191 and the common electrode form a capacitor (hereinafter, referred to as a "liquid crystal capacitor") to maintain the applied voltage even after the thin film transistor is turned off.

The pixel electrode 191 may overlap a storage electrode line (not shown) to form a storage capacitor and reinforce voltage storage capacity of the liquid crystal capacitor therethrough.

The pixel electrode 191 may include a transparent conductor such as indium tin oxide ("ITO") or indium zinc oxide ("IZO").

FIGS. 3 to 9 are cross-sectional views taken along line II-II of FIG. 1 illustrating an exemplary embodiment of a manufacturing method for a thin film transistor array panel according to the invention.

Figure 3:
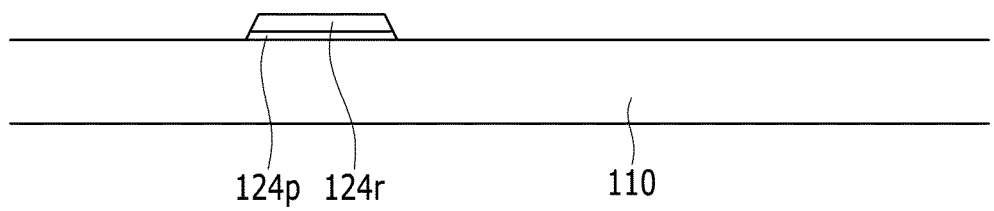
FIGS. 3 to 9 are cross-sectional views taken along line II-II of FIG. 1, illustrating an exemplary embodiment of a manufacturing method for a thin film transistor array panel according to the invention.

Referring to FIG. 3, on the insulation substrate 110 including transparent glass or plastic, at least one of titanium (Ti), tantalum (Ta), molybdenum (Mo), or an alloy thereof is laminated as a first layer, and copper (Cu) or a copper (Cu) alloy is laminated thereon as a second layer, to form a dual layer structure.

Thereafter, after laminating and patterning a photosensitive film (not shown), a first etchant is used to etch the patterned photosensitive film (not shown) as a mask together with the dual layer structure to form the gate line 121 including the gate electrode 124. The gate line 121 including the gate electrode 124 includes the lower layers 121p (not shown) and 124p and the upper layers 121r (not shown) and 124r. In this case, the first etchant used may be used when the lower layers 121p and 124p and the upper layers 121r and 124r are etched together. In the exemplary embodiment, the gate line 121 and the gate electrode 124 have the dual-layered structure, but may also have a single-layered structure.

Figure 4:
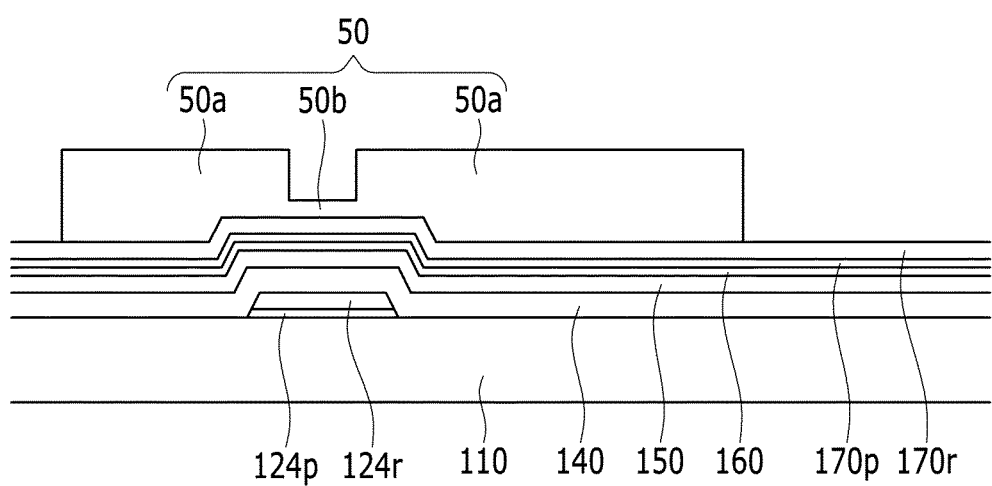

Referring to FIG. 4, a gate insulating layer 140, a first amorphous silicon layer 150, a second amorphous silicon layer 160, a first metal layer 170p and a second metal layer 170r are laminated on the gate line 121 and the gate electrode 124. The first and second metal layers 170p and 170r may be collectively referred to as metal layer 170. The first amorphous silicon layer 150 and the second amorphous silicon layer 160 correspond to semiconductor material layers, and the first metal layer 170p and the second metal layer 170r correspond to data wire material layers.

The first amorphous silicon layer 150 may not include an impurity, a conductive impurity may be doped on the second amorphous silicon layer 160, the first metal layer 170p may include at least one of titanium (Ti), tantalum (Ta), molybdenum (Mo), or an alloy thereof, and the second metal layer 170r may include copper or a copper alloy.

A photosensitive film (photo resist) is formed and patterned thereon to form a first photosensitive film pattern 50. The first photosensitive film pattern 50 has a first thick region 50a and a second relatively thin region 50b. A thickness difference of the first photosensitive film pattern 50 may control a quantity of irradiated light by using the first photosensitive film pattern 50 a mask or may be used in a reflow method. In the case of controlling the quantity of the light, the mask may include a slit pattern or lattice pattern or a translucent layer. The second thin region 50b corresponds to a position where a channel region of the thin film transistor is formed.

Figure 5:
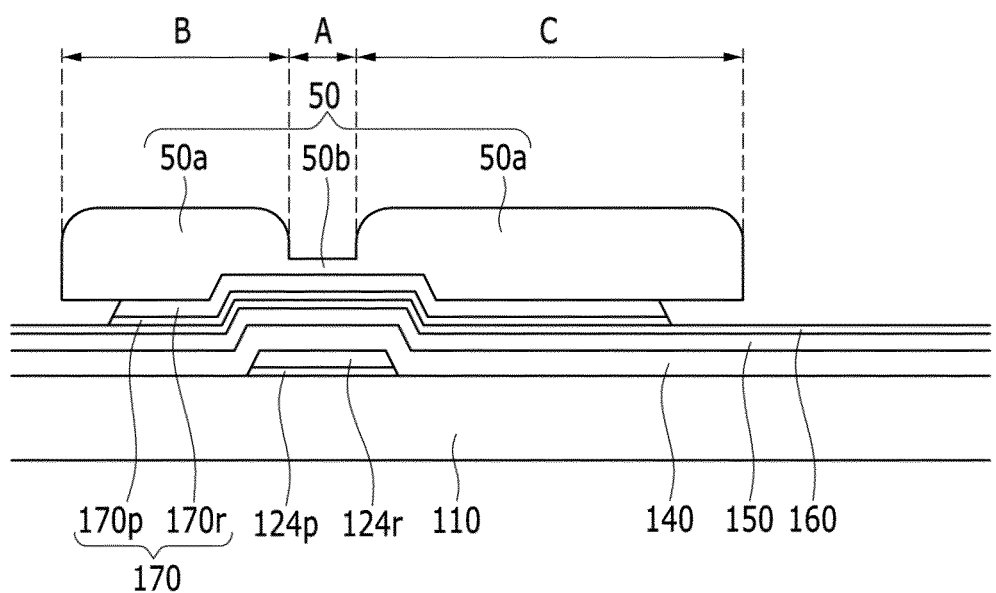

Referring to FIG. 5, the first metal layer 170p and the second metal layer 170r are wet-etched by using a second etchant capable of etching the first metal layer 170p and the second metal layer 170r together, by using the first photosensitive film pattern 50 as a mask. Herein, the second etchant may be the same as the first etchant used when the lower layers 121p and 124p and upper layers 121r and 124r of the gate line 121 are etched.

As shown in FIG. 5, when the first metal layer 170p and the second metal layer 170r are etched, portions of the first metal layer 170p and the second metal layer 170r covered by the first photosensitive film pattern 50 are etched and removed with the second etchant and as a result, as shown in FIG. 5, the boundary edge of the first metal layer 170p and the second metal layer 170r is positioned in regions A, B and C of the first photosensitive film pattern 50.

In this case, the second etchant etching the first metal layer 170p and the second metal layer 170r does not etch the gate insulating layer 140, the first amorphous silicon layer 150 and the second amorphous silicon layer 160.

Figure 6:
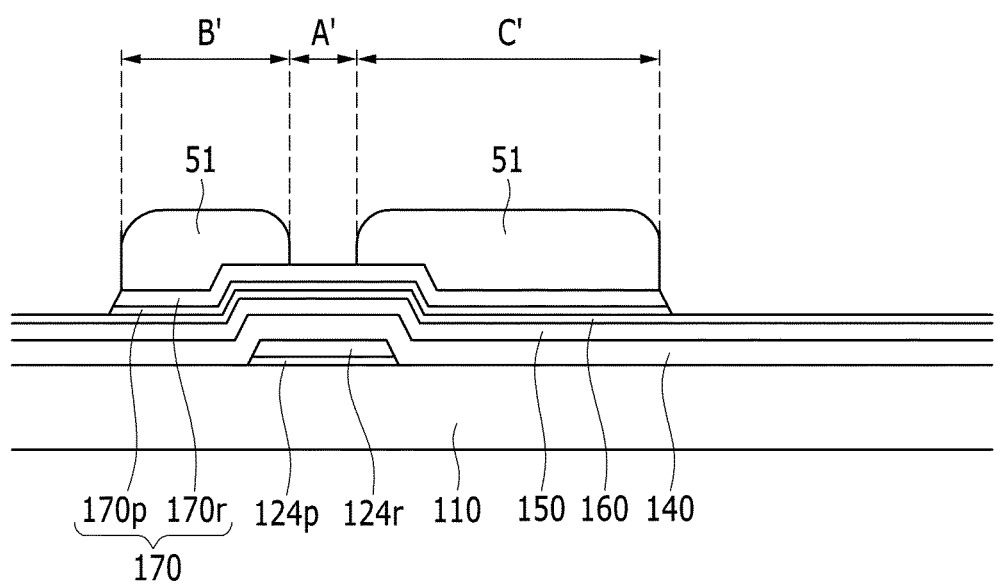

Referring to FIG. 6, the second thin region 50b is removed by etching back the first photosensitive film pattern 50. In the etching back the first photosensitive film pattern 50, the first region 50a is etched together and as a result, the width and the height of the first region 50a are reduced to form a second photosensitive film pattern 51 as shown in FIG. 6. The second photosensitive film pattern 51 is formed in regions A', B' and C' which are smaller in a planar dimension than the regions A, B, and C of the first photosensitive film pattern 50 as shown in FIG. 5. The second photosensitive film pattern 51 exposes a portion of the upper surface of the second metal layer 170r, and the exposed portion of the upper surface of the second metal layer 170r corresponds to a channel region of the semiconductor layer to be formed.

Figure 7:
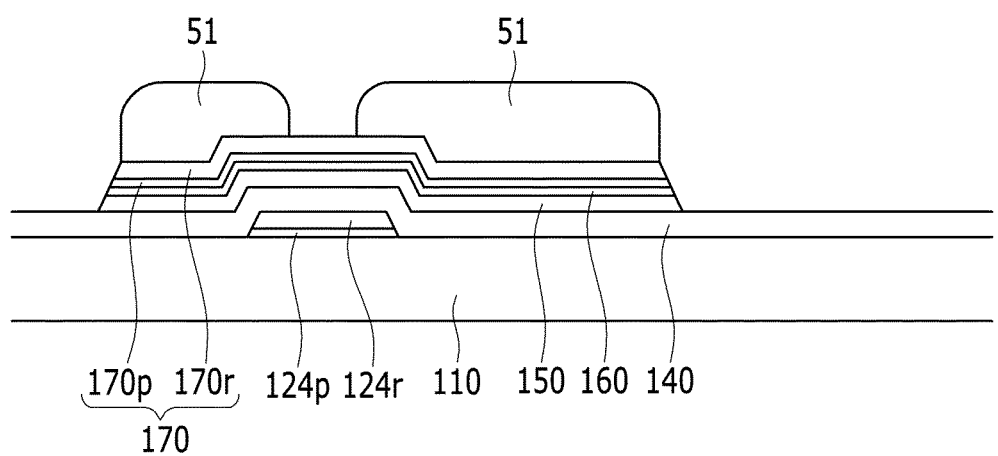

Referring to FIG. 7, the first amorphous silicon layer 150 and the second amorphous silicon layer 160 are etched by using the second photosensitive film pattern 51 as a mask. In the exemplary embodiment, the etching of the first amorphous silicon layer 150 and the second amorphous silicon layer 160 may use a first non-sulfur (S) fluorine (F)-based gas. In one exemplary embodiment, the first gas may include at least one of nitrogen trifluoride (NF3), tetrafluoromethane (CF4), hexafluoroethane (C2F6), trifluoromethane (CHF3), difluoromethane (CH2F2), fluoromethane (CH3F), hexafluorobutyne (C4F6), octafluorobutene (C4F8), octafluoropentyne (C5F8), or fluorine (F2)

The first gas may also include ammonia (NH3) gas, instead of the fluorine-based gas.

In order to etch an amorphous silicon layer in the related art, gas such as sulphur hexafluoride (SF6) is used, but residues such as copper sulfide (CuS) are formed, to thereby deteriorating the characteristic of the channel part. However, in the exemplary embodiment, when the non-sulfur (S) fluorine-based gas is used, the residues as in the related art are not formed, and the corrosion of the metal layer does not occur by using the fluorine-based gas.

In the etching of the first amorphous silicon layer 150 and the second amorphous silicon layer 160 which are otherwise referred to as the semiconductor material layers, in order to relieve a problem of damaging the gate insulating layer 140 disposed below the first amorphous silicon layer 150, a second gas containing at least one of chlorine gas (Cl2), oxygen gas (O2), nitrogen gas (N2), or helium gas (He) may be added into the first non-sulfur (S) fluorine (F)-based gas.

In this case, the content of the second gas added into the first gas may be controlled so that etching selectivity of the first amorphous silicon layer 150 to the gate insulating layer 140 may be about 0.85:1 or more.

Figure 16:
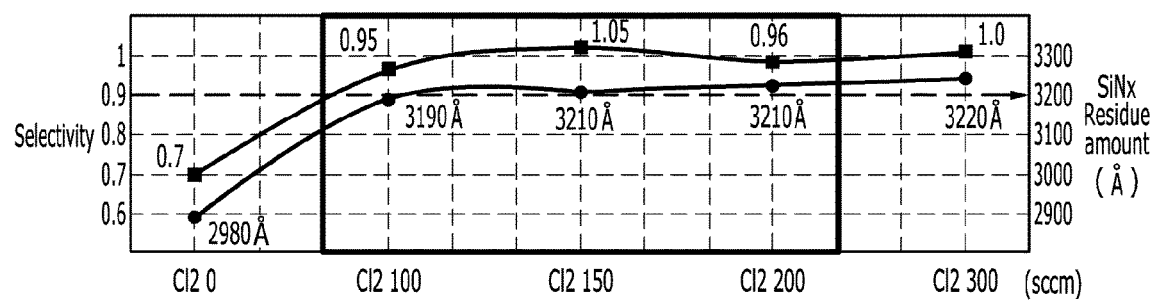
FIG. 16 shows a change in the etching selectivity of semiconductor material layers and a residue amount of a gate insulating layer, measured while using a first gas at a constant content and changing the content of the second gas.

FIG. 16 shows a change in the etching selectivity of the first amorphous silicon layer 150 and the gate insulating layer 140, and a residue amount of the gate insulating layer 140 in angstroms (Å). The etching selectivity and residue amount is measured while using a first gas including NF3 at a constant content of 2000 standard cubic centimeters per minute (sccm), and while changing the content of the second gas including chlorine gas (Cl2).

As shown in FIG. 16, the result of an experiment shows that in the case where the content of the first gas is 2000 sccm, and the content of the second gas is 50 sccm, the etching selectivity is 0.85:1, and in the case where the content of the second gas is 100 sccm, the etching selectivity is 0.95:1.

According to the graph in FIG. 16, as the content of the second gas increases, the etching selectivity of the first amorphous silicon layer 150 and the gate insulating layer 140 increases. However, the content of the second chlorine gas (Cl2) added to the first gas may be about 700 sccm or less to reduce or effectively prevent corrosion of the metal layer. In addition, the content of the second gas added into the first gas may be 35% or less of the first gas.

Figure 8:
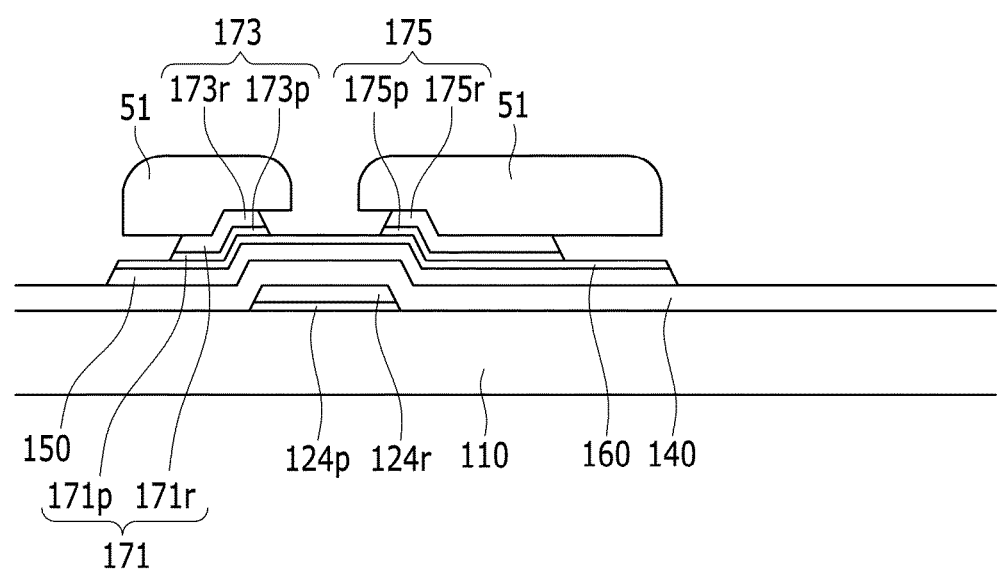

Referring to FIG. 8, the second metal layer 170r and the first metal layer 170p are etched with a third etchant by using the second photosensitive film pattern 51 as a mask. The third etchant used therein may be the same second etchant used in FIG. 5.

As shown in FIG. 8, when the first metal layer 170p and the second metal layer 170r are etched, the sides of the first metal layer 170p and the second metal layer 170r which are covered by the second photosensitive film pattern 51 are also etched by the etchant, and as a result, as shown in FIG. 8, the boundary of the first metal layer 170p and the second metal layer 170r is positioned in the regions A', B' and C' of the second photosensitive film pattern 51. In this case, the source electrode 173 and the drain electrode 175 which are separated from each other are formed.

Herein, the first amorphous silicon layer 150 and the second amorphous silicon layer 160 which correspond to the semiconductor material layers, protrude further than edges of the source electrode 173 and the drain electrode 175. However, in the exemplary embodiment, since the etching-back is first performed before the semiconductor material layers is etched, a protrusion degree of the first and second amorphous silicon layers 150 and 160 may be reduced. Accordingly, unnecessary capacitance is reduced, such that it is possible to prevent a screen defect of a display device.

Figure 9:
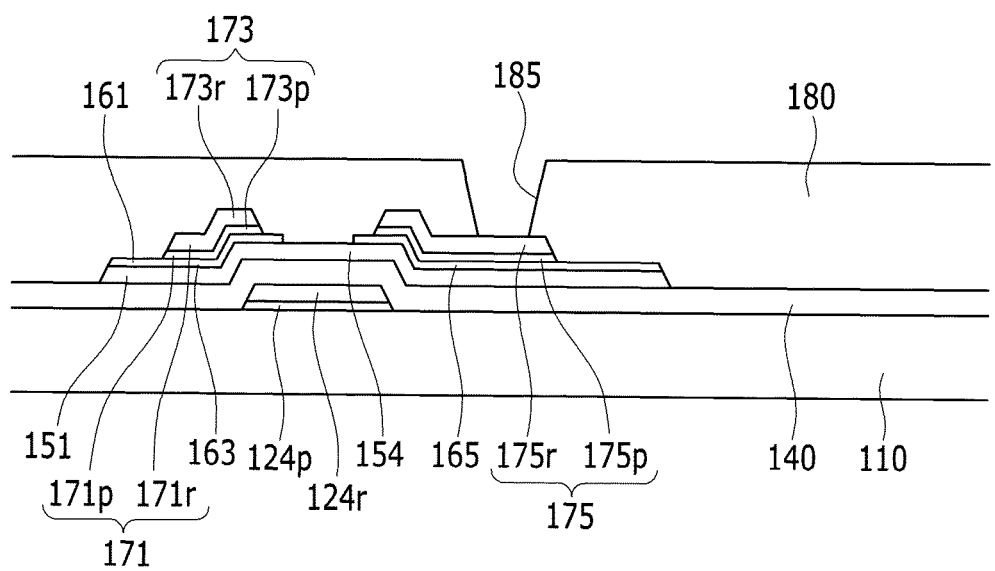

Next, referring to FIG. 9, a portion of the second amorphous silicon layer 160 which is overlapped with the gate electrode 124 is dry-etched by using the second photosensitive film pattern 51 as a mask to expose the projection 154 of the semiconductor layer 151 which forms the channel of the thin film transistor.

The second amorphous silicon layer 160 is etched and separated to form the ohmic contacts 161, 163 and 165.

As described above, when the photosensitive film patterns having different thicknesses are used, the ohmic contacts 161, 163 and 165, which have the same planar patterns as the lower layers 171p, 173p and 175p of the data line 171, the source electrode 173 and the drain electrode 175, are formed. Additionally, the semiconductor layers 151 and 154 have substantially the same planar pattern as the lower layers 171p, 173p and 175p of the data line 171, the source electrode 173 and the drain electrode 175, except for the exposed portion between the drain electrode 175 and the source electrode 173.

Next, after the photosensitive film pattern 51 is removed by ashing, the passivation layer 180 is formed including an organic material or an inorganic material. A contact hole 185 exposing the upper layer 175r of the drain electrode 175 is formed by using a photosensitive film pattern. Herein, in order to form the contact hole 185, the patterning of the passivation layer 180 may use a non-sulfur (S) fluorine (F)-based gas. In one exemplary embodiment, the non-sulfur (S) fluorine (F)-based gas may be the same as the gas used when the semiconductor material layers are etched in the forming of the thin film transistor described above. By using the a non-sulfur (S) fluorine (F)-based gas, unnecessary residue materials in the contact hole 185 are reduced or effectively prevented, such that contact defects with the drain electrode 175 and the pixel electrode 191 are reduced or effectively prevented.

Referring to FIG. 2, a transparent conductor such as ITO or IZO is laminated and etched to form the pixel electrode 191 which is electrically in contact with the exposed drain electrode 175 via the contact hole 185.

Figure 10:
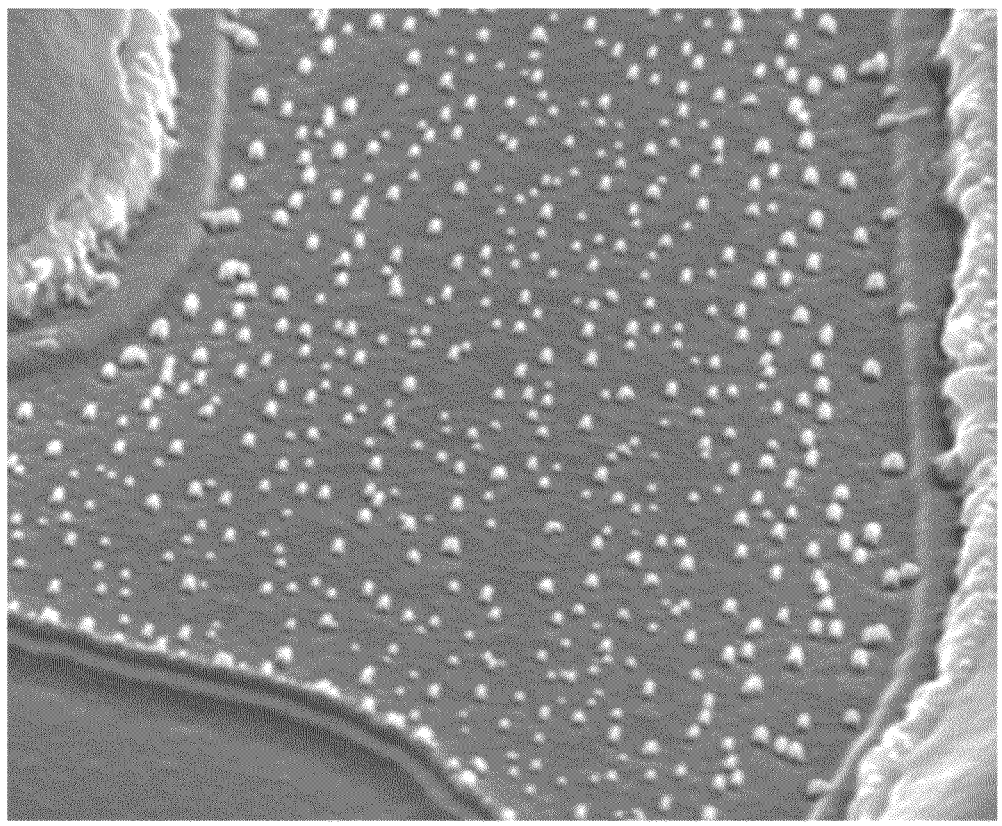
FIG. 10 is a photograph of a channel part after etching a semiconductor material layer by using sulphur hexafluoride gas.
Figure 11:
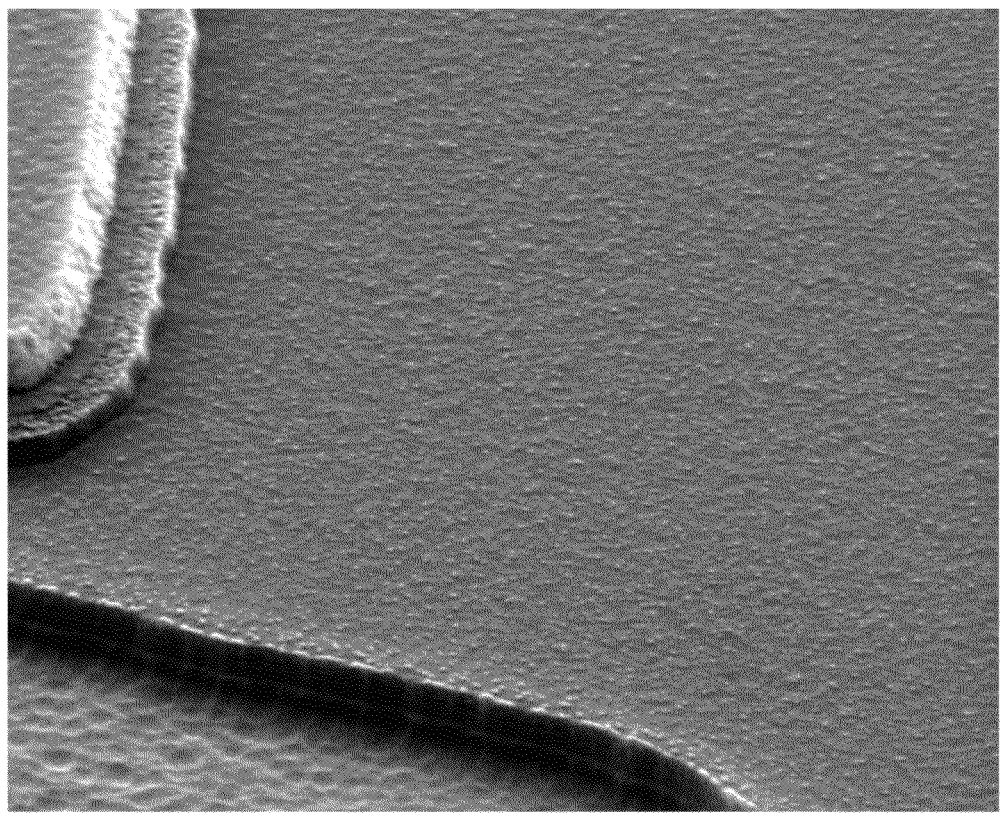
FIG. 11 is a photographing of a channel part after etching a semiconductor material layer by using nitrogen trifluoride gas.

FIG. 10 is a photograph of a channel part after etching a semiconductor material layer by using sulphur hexafluoride gas, and FIG. 11 is a photograph of a channel part after etching a semiconductor material layer by using nitrogen trifluoride gas.

Referring to FIG. 10, like the related art, in the case where sulphur hexafluoride gas (SF6) is used when the semiconductor material layer is etched, residue materials such as copper sulfide (CuS) are shown on the surface of the channel part. Referring to FIG. 11, referring to the exemplary embodiments described above, in the case where nitrogen trifluoride gas (NF3) is used when the semiconductor material layer is etched, the surface of the channel part is shown in a clean state without the residue materials.

FIGS. 12 to 15 are cross-sectional views illustrating another exemplary embodiment of a manufacturing method for a thin film transistor array panel according to the invention.

The exemplary embodiment of FIGS. 12 to 15 is substantially similar to the exemplary embodiment according to FIGS. 3 to 9 described above, but the etching-back is in a different position in the exemplary embodiment of FIGS. 12 to 15.

The contents described in FIGS. 3 to 5 are also the same in the exemplary embodiment.

Figure 12:
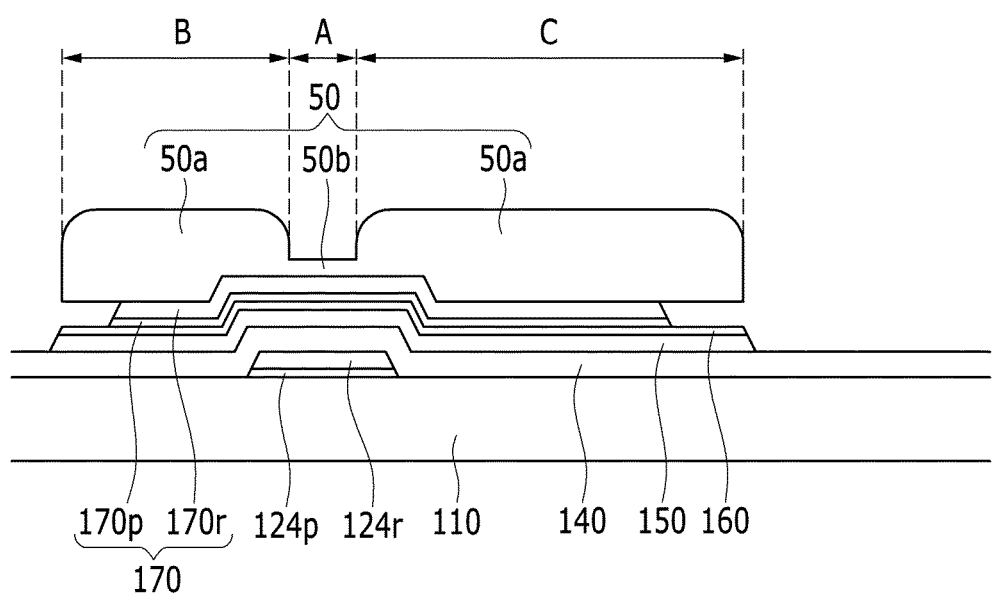
FIGS. 12 to 15 are cross-sectional views illustrating another exemplary embodiment of a manufacturing method for a thin film transistor array panel according to the invention.

Referring to FIG. 12, unlike the above exemplary embodiment, the first amorphous silicon layer 150 and the second amorphous silicon layer 160 are etched by using the first photosensitive film pattern 50 as a mask before the etching-back process is performed.

Figure 13:
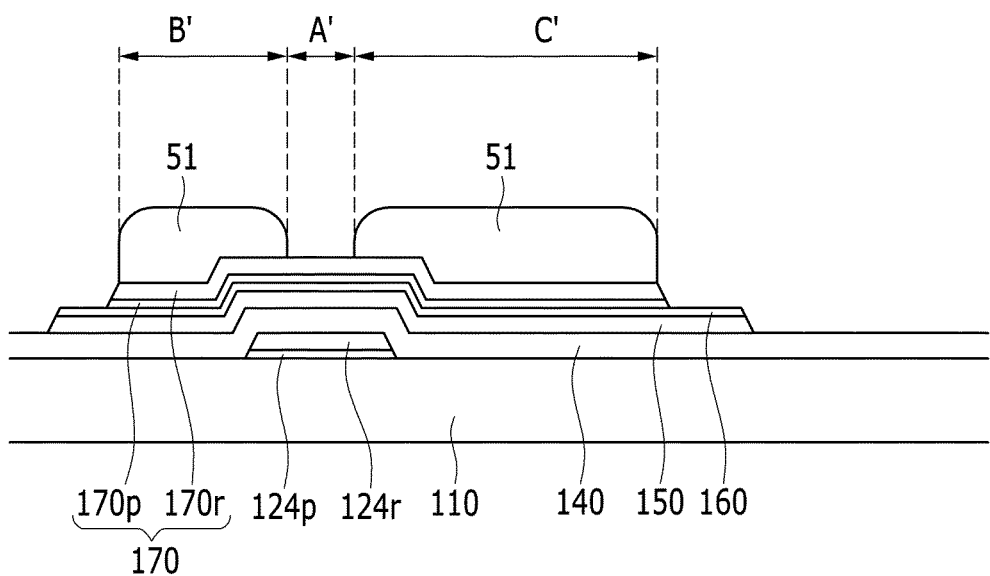

Referring to FIG. 13, the first photosensitive film pattern 50 is etched back to remove the second region 50b having a thin thickness. In the etching back the first photosensitive film pattern 50, the first region 50a is etched together and thus the width and the height of the first region 50a are reduced to form the second photosensitive film pattern 51 as shown in FIG. 13. The second photosensitive film pattern 51 is formed in the regions A', B', and C' which are smaller in planar dimension than the regions A, B, and C of the first photosensitive film pattern 50 shown in FIG. 12. The second photosensitive film pattern 51 exposes a portion of the upper surface of the second metal layer 170r, and the exposed portion of the upper surface of the second metal layer 170r corresponds to a channel region of the semiconductor layer to be formed.

Figure 14:
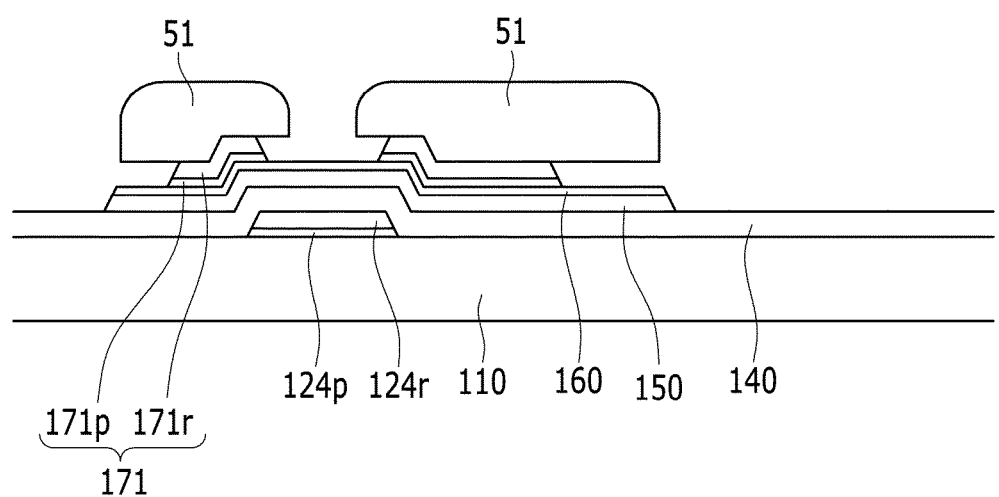

Referring to FIG. 14, the second metal layer 170r and the first metal layer 170p are etched with a third etchant by using the second photosensitive film pattern 51 as a mask. The third etchant used therein may be the same second etchant used in FIG. 5.

As shown in FIG. 14, when the first metal layer 170p and the second metal layer 170r are etched, the sides of the first metal layer 170p and the second metal layer 170r which are covered by the second photosensitive film pattern 51 are also etched by the etchant, and as a result, as shown in FIG. 14, the boundary of the first metal layer 170p and the second metal layer 170r is positioned in the regions A', B', and C' of the second photosensitive film pattern 51. In this case, the source electrode 173 and the drain electrode 175 which are separated from each other are formed.

Herein, the first amorphous silicon layer 150 and the second amorphous silicon layer 160 which correspond to the semiconductor material layers protrude further than edges of the source electrode 173 and the drain electrode 175. The protruding degree may be larger than that of the exemplary embodiment shown in FIGS. 3 to 9. However, in the exemplary embodiment, since the first amorphous silicon layer 150 and the second amorphous silicon layer 160 are etched while the portion corresponding to the channel part is covered by the first photosensitive film pattern 50, it is possible to suppress the residue materials from being generated in the channel part when the semiconductor material layers (e.g., first amorphous silicon layer 150 and the second amorphous silicon layer 160) are etched.

Figure 15:
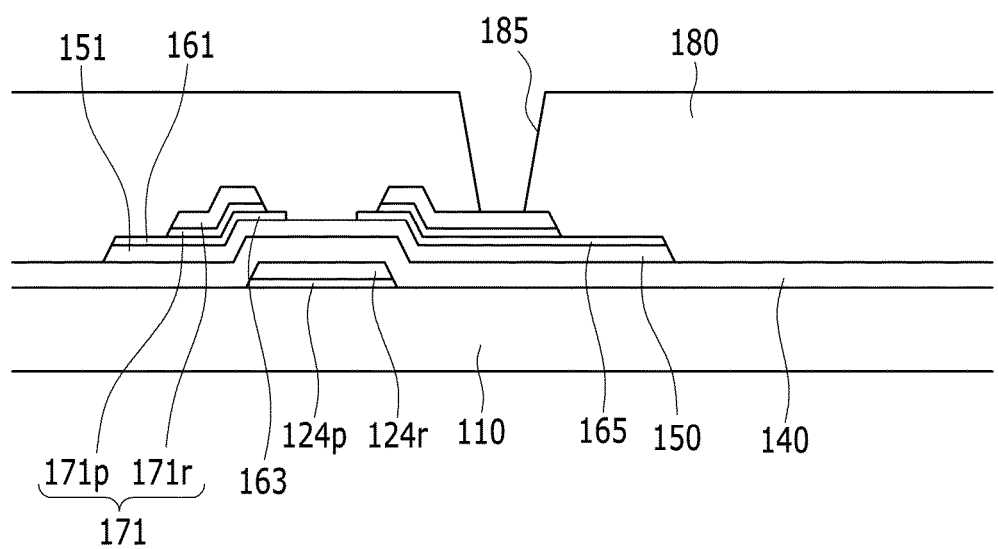

Referring to FIG. 15, as described in FIG. 9, after the second photosensitive film pattern 51 is removed by ashing, the passivation layer 180 including the contact hole 185 is formed.

Referring again to FIG. 2, a transparent conductor such as ITO or IZO is laminated and etched to form the pixel electrode 191 which is electrically in contact with the exposed drain electrode 175 via the contact hole 185.

In addition, the contents described in FIGS. 3 to 9 may be applied to the exemplary embodiment shown in FIGS. 12 to 15.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A manufacturing method for a thin film transistor array panel, the method comprising:
    providing a gate line comprising a gate electrode, on a substrate;
    providing a gate insulating layer covering the gate line;
    providing a semiconductor material layer on the gate insulating layer;
    providing a data wire material layer on the semiconductor material layer;
    providing a first photosensitive film pattern on the data wire material layer, the first photosensitive film pattern comprising a first region, and a second region having a larger thickness than the first region;
    etching the data wire material layer by using the first photosensitive film pattern as a mask;
    etching back the first photosensitive film pattern to provide a second photosensitive film pattern which exposes an upper surface of the data wire material layer corresponding to a channel region of a thin film transistor;
    etching the semiconductor material layer, while the upper surface of the data wire material layer corresponding to the channel region of the thin film transistor is exposed by the second photosensitive film pattern, by using the second photosensitive film pattern as a mask; and
    etching the data wire material layer by using the second photosensitive film pattern as a mask, to form a source electrode and a drain electrode,
    wherein the etching the semiconductor material layer comprises using a first non-sulfur fluorinated gas.

2. The manufacturing method for a thin film transistor array panel of claim 1, wherein:
    the first non-sulfur fluorinated gas comprises at least one of nitrogen trifluoride (NF3), tetrafluoromethane (CF4), hexafluoroethane (C2F6), trifluoromethane (CHF3), difluoromethane (CH2F2), fluoromethane (CH3F), hexafluorobutyne (C4F6), octafluorobutene (C4F8), octafluoropentyne (C5F8), or fluorine (F2).

3. The manufacturing method for a thin film transistor array panel of claim 1, wherein:
    the data wire material layer is provided by laminating a first metal layer and a second metal layer in sequence.

4. The manufacturing method for a thin film transistor array panel of claim 3, wherein:
    the first metal layer comprises at least one of titanium, tantalum, molybdenum, or an alloy thereof, and
    the second metal layer comprises copper or a copper alloy.

5. The manufacturing method for a thin film transistor array panel of claim 4, wherein:
    the etching the data wire material layer by using the first photosensitive film pattern as a mask, comprises wet-etching.

6. The manufacturing method for a thin film transistor array panel of claim 1, wherein:
    the etching the semiconductor material layer comprises dry-etching by adding a second gas to the first non-sulfur fluorinated gas, the second gas comprising at least one of chlorine gas (Cl2), oxygen gas (O2), nitrogen gas (N2), or helium gas (He).

7. The manufacturing method for a thin film transistor array panel of claim 6, wherein:
    the semiconductor material layer is etched in a state where etching selectivity of the semiconductor material layer and the gate insulating layer is about 0.85:1 or more, by adding the second gas to the first non-sulfur fluorinated gas.

8. The manufacturing method for a thin film transistor array panel of claim 1, further comprising:
removing the second photosensitive film pattern;
providing a passivation layer comprising a contact hole exposing the drain electrode, after the removing the second photosensitive film pattern; and
providing a pixel electrode connected with the drain electrode through the contact hole, on the passivation layer.

9. The manufacturing method for a thin film transistor array panel of claim 8, wherein:
the providing the passivation layer comprising the contact hole uses a second non-sulfur fluorinated gas.

10. The manufacturing method for a thin film transistor array panel of claim 9, wherein:
the second non-sulfur fluorinated gas comprises at least one of nitrogen trifluoride (NF3), tetrafluoromethane (CF4), hexafluoroethane (C2F6), trifluoromethane (CHF3), difluoromethane (CH2F2), fluoromethane (CH3F), hexafluorobutyne (C4F6), octafluorobutene (C4F8), octafluoropentyne (C5F8), or fluorine (F2).

11. A manufacturing method for a thin film transistor array panel, the method comprising:
providing a gate line comprising a gate electrode, on a substrate;
providing a gate insulating layer covering the gate line;
providing a semiconductor material layer on the gate insulating layer;
providing a data wire material layer on the semiconductor material layer;
providing a first photosensitive film pattern on the data wire material layer, the first photosensitive film pattern comprising a first region, and a second region having a larger thickness than the first region;
etching the data wire material layer by using the first photosensitive film pattern as a mask;
etching the semiconductor material layer by using the same first photosensitive film pattern used for etching the data wire material layer, as a mask;
providing a second photosensitive film pattern by etching back the first photosensitive film pattern; and
etching the data wire material layer by using the second photosensitive film pattern as a mask,
wherein the etching the semiconductor material layer comprises using a first non-sulfur fluorinated gas.

12. The manufacturing method for a thin film transistor array panel of claim 11, wherein:
the first non-sulfur fluorinated gas comprises at least one of nitrogen trifluoride (NF3), tetrafluoromethane (CF4), hexafluoroethane (C2F6), trifluoromethane (CHF3), difluoromethane (CH2F2), fluoromethane (CH3F), hexafluorobutyne (C4F6), octafluorobutene (C4F8), octafluoropentyne (C5F8), or fluorine (F2).

13. The manufacturing method for a thin film transistor array panel of claim 12, wherein:
the second photosensitive film pattern exposes a portion of the semiconductor material layer corresponding to a channel region of a thin film transistor.

14. The manufacturing method for a thin film transistor array panel of claim 13, wherein:
the data wire material layer is provided by laminating a first metal layer and a second metal layer in sequence.

15. The manufacturing method for a thin film transistor array panel of claim 14, wherein:
the first metal layer comprises at least one of titanium, tantalum, molybdenum, or an alloy thereof, and
the second metal layer comprises copper or a copper alloy.

16. The manufacturing method for a thin film transistor array panel of claim 15, wherein:
the etching the data wire material layer by using the first photosensitive film pattern as a mask, comprises wet-etching.

17. The manufacturing method for a thin film transistor array panel of claim 11, wherein:
the etching the semiconductor material layer comprises dry-etching by adding a second gas to the first non-sulfur fluorinated gas, the second gas comprising at least one of chlorine gas (Cl2), oxygen gas (O2), nitrogen gas (N2), or helium gas (He).

18. The manufacturing method for a thin film transistor array panel of claim 17, wherein:
the semiconductor material layer is etched in a state where etching selectivity of the semiconductor material layer and the gate insulating layer is about 0.85:1 or more, by adding the second gas to the first non-sulfur fluorinated gas.

19. The manufacturing method for a thin film transistor array panel of claim 11, further comprising:
removing the second photosensitive film pattern;
providing a passivation layer comprising a contact hole exposing the drain electrode, after the removing the second photosensitive film pattern; and
providing a pixel electrode connected with the drain electrode through the contact hole, on the passivation layer.

20. The manufacturing method for a thin film transistor array panel of claim 19, wherein:
the providing of the passivation layer comprising the contact hole uses a second non-sulfur fluorinated gas.

21. The manufacturing method for a thin film transistor array panel of claim 20, wherein:
the second non-sulfur fluorinated gas comprises at least one of nitrogen trifluoride (NF3), tetrafluoro ethane (C2F6), trifluoromethane (CHF3), difluoromethane (CH2F2), fluoromethane (CH3F), hexafluorobutyne (C4F6), octafluorobutene (C4F8), octafluoropentyne (C5F8), or fluorine (F2).

* * * * *